(12) United States Patent
De Haan et al.

(10) Patent No.: US 12,033,936 B2
(45) Date of Patent: Jul. 9, 2024

(54) RESONANT INDUCTIVE-CAPACITIVE ISOLATED DATA CHANNEL

(71) Applicant: Texas Instruments Incorporated, Dallas, TX (US)

(72) Inventors: Klaas De Haan, Berltsum (NL); Mikhail Valeryevich Ivanov, Freising (DE); Tobias Bernhard Fritz, Mainburg (DE); Swaminathan Sankaran, Allen, TX (US); Thomas Dyer Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/963,149

(22) Filed: Oct. 10, 2022

(65) Prior Publication Data
US 2023/0031204 A1    Feb. 2, 2023

Related U.S. Application Data

(62) Division of application No. 17/120,123, filed on Dec. 12, 2020, now Pat. No. 11,476,189.

(51) Int. Cl.
| | | |
|---|---|---|
| *H01L 23/522* | (2006.01) | |
| *H01L 21/50* | (2006.01) | |
| *H01L 23/50* | (2006.01) | |
| *H04L 25/02* | (2006.01) | |

(52) U.S. Cl.
CPC .......... *H01L 23/5227* (2013.01); *H01L 21/50* (2013.01); *H01L 23/50* (2013.01); *H01L 23/5222* (2013.01); *H04L 25/0268* (2013.01)

(58) Field of Classification Search
CPC ...................................................... H01L 21/50
See application file for complete search history.

(56) References Cited

U.S. PATENT DOCUMENTS

| | | | |
|---|---|---|---|
| 4,369,557 A | 1/1983 | Vandebult | |
| 5,172,461 A | 12/1992 | Pichl | |
| 9,299,697 B2 | 3/2016 | West et al. | |
| 9,728,837 B2 * | 8/2017 | Pagani | G06K 19/07749 |
| 2002/0198110 A1 | 12/2002 | Salkola et al. | |
| 2007/0023862 A1 * | 2/2007 | Takagi | H01L 23/5223 257/E21.022 |
| 2014/0346887 A1 | 11/2014 | Bhamidipati et al. | |

(Continued)

FOREIGN PATENT DOCUMENTS

EP        0698870 A1    2/1996

*Primary Examiner* — Peniel M Gumedzoe
(74) *Attorney, Agent, or Firm* — Michelle F. Murray; Frank D. Cimino

(57) ABSTRACT

An electronic device has a substrate and first and second metallization levels with a resonant circuit. The first metallization level has a first dielectric layer on a side of the substrate, and a first metal layer on the first dielectric layer. The second metallization level has a second dielectric layer on the first dielectric layer and the first metal layer, and a second metal layer on the second dielectric layer. The electronic device includes a first plate in the first metal layer, and a second plate spaced apart from the first plate in the second metal layer to form a capacitor. The electronic device includes a winding in one of the first or second metal layers and coupled to one of the first or second plates in a resonant circuit.

16 Claims, 16 Drawing Sheets

(56) References Cited

U.S. PATENT DOCUMENTS

| | | |
|---|---|---|
| 2015/0071380 A1 | 3/2015 | Morgan et al. |
| 2015/0206934 A1* | 7/2015 | Funaya .................. H01L 24/06 438/3 |
| 2015/0222004 A1 | 8/2015 | Sankaran et al. |
| 2015/0333055 A1 | 11/2015 | West et al. |
| 2015/0381219 A1 | 12/2015 | Kramer et al. |
| 2016/0300907 A1 | 10/2016 | Selvaraj et al. |
| 2018/0278229 A1 | 9/2018 | Sankaran et al. |
| 2019/0109075 A1* | 4/2019 | Bahr ................. H01L 23/49548 |
| 2020/0027848 A1 | 1/2020 | Bonifield et al. |
| 2020/0312794 A1 | 10/2020 | West et al. |

* cited by examiner

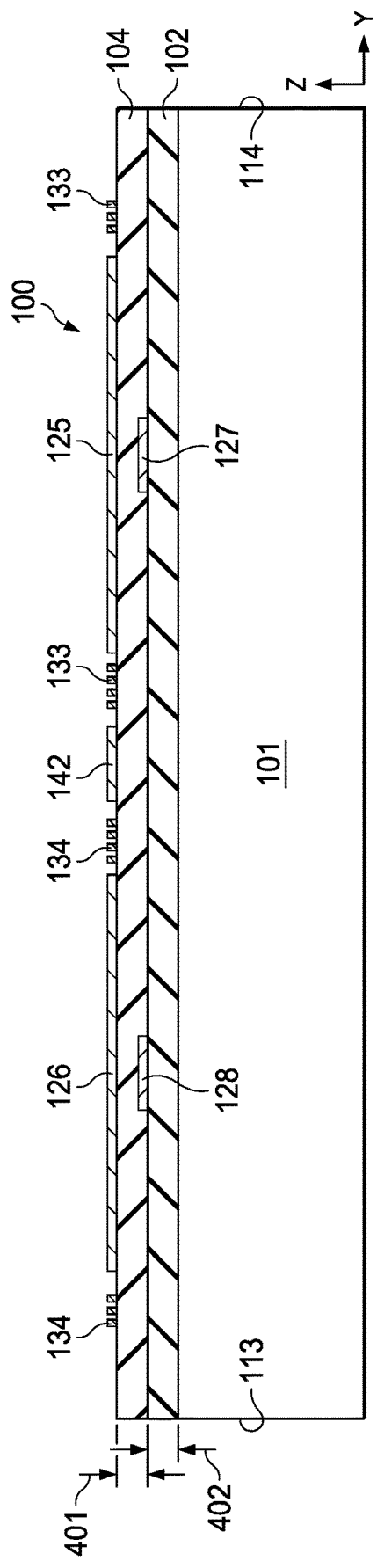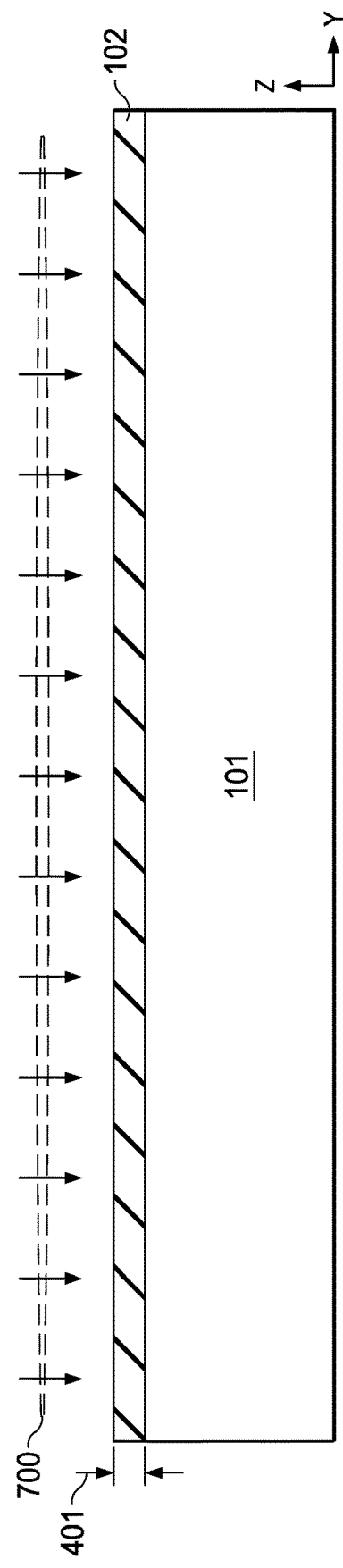

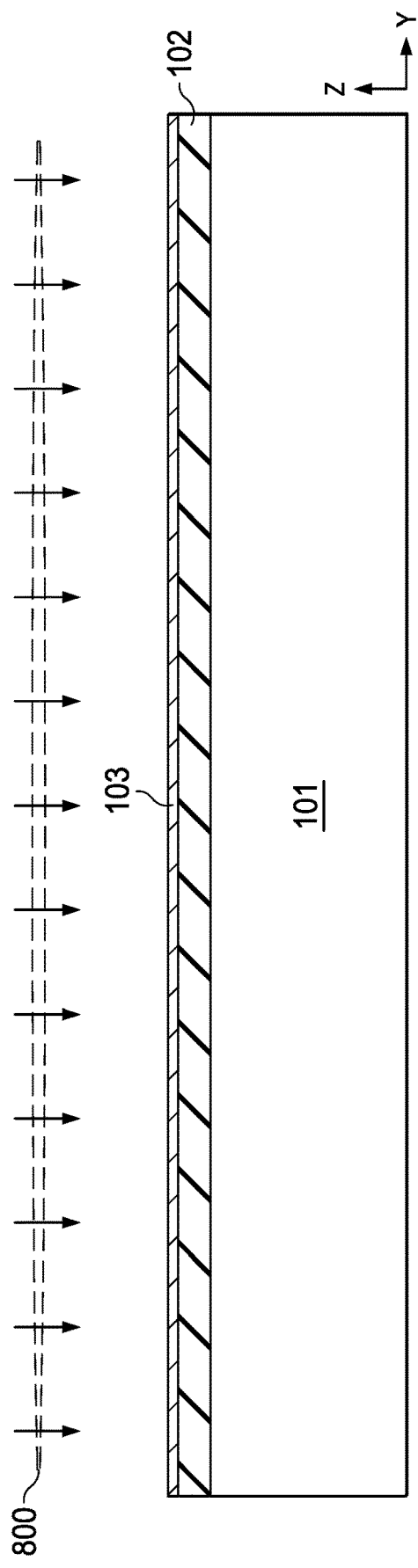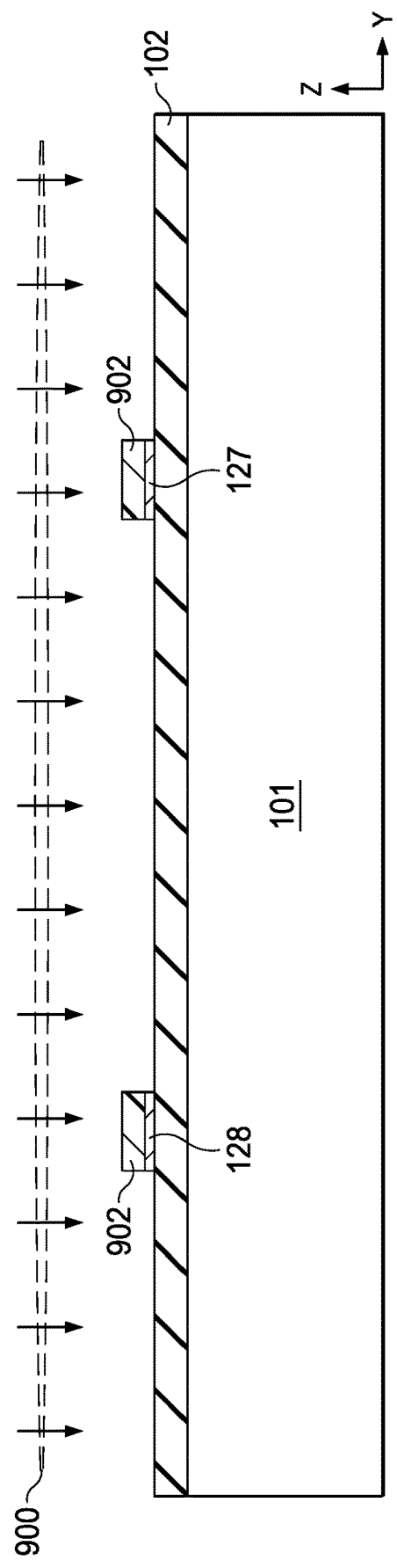

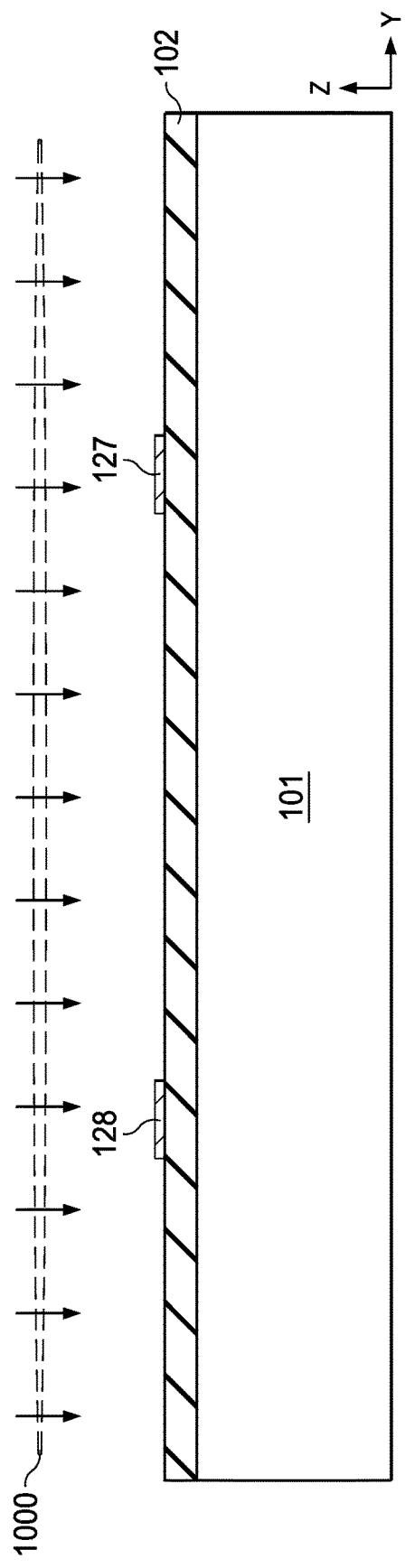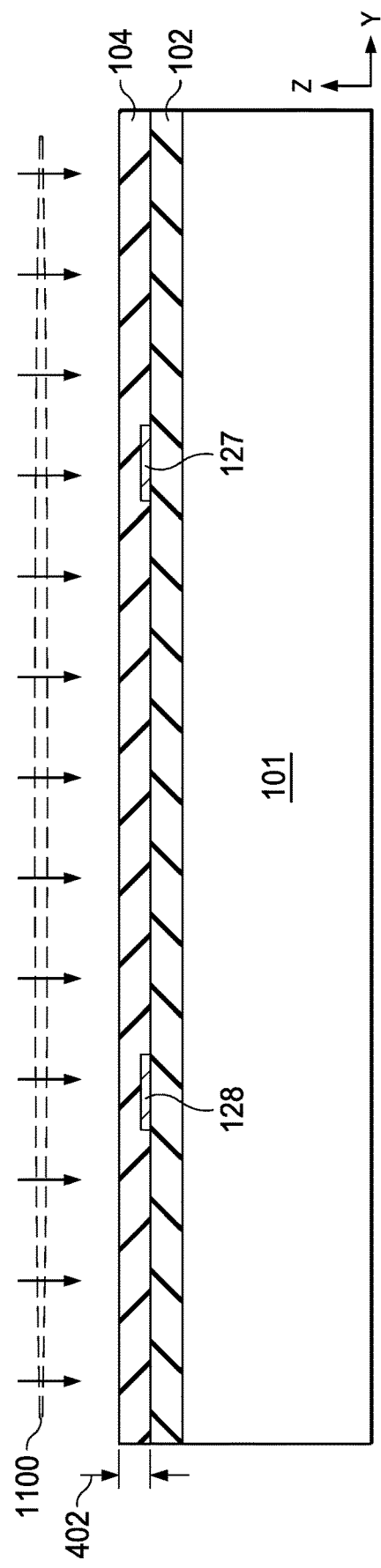

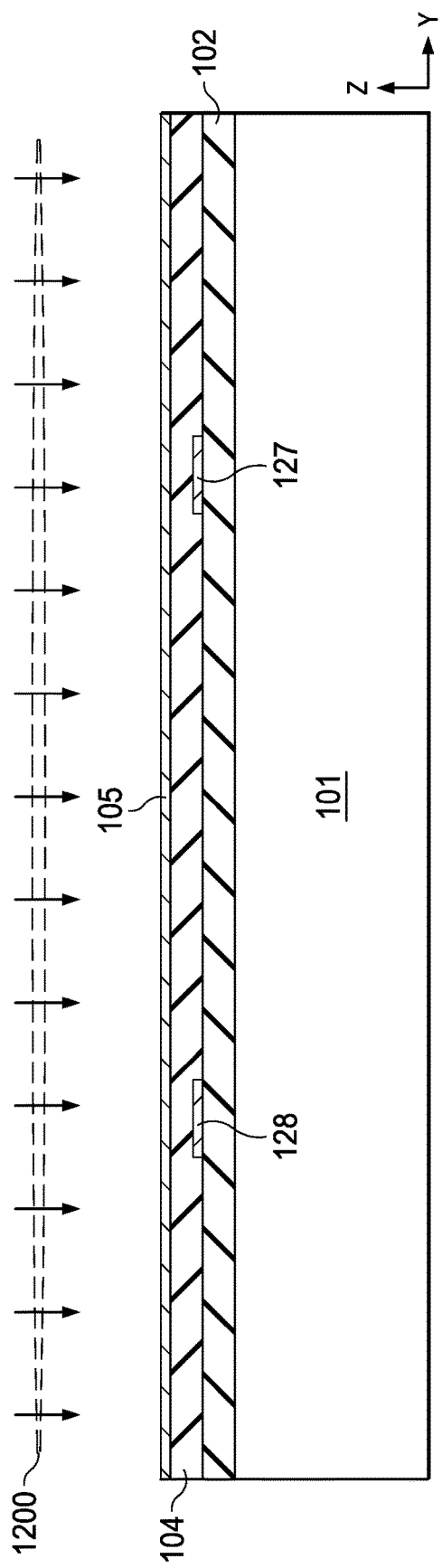
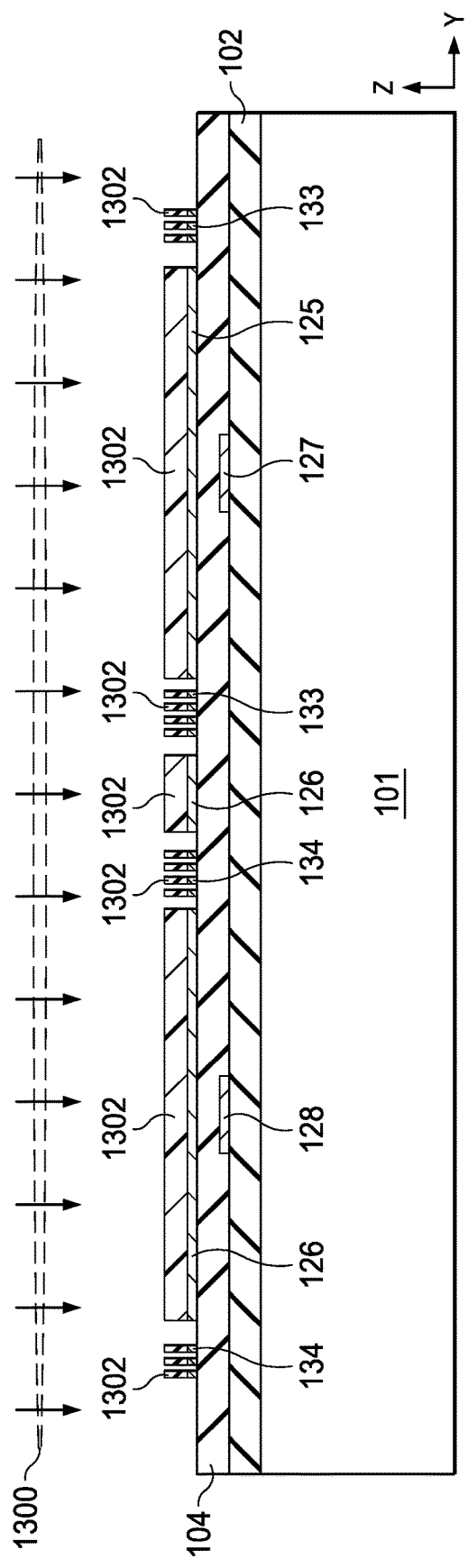

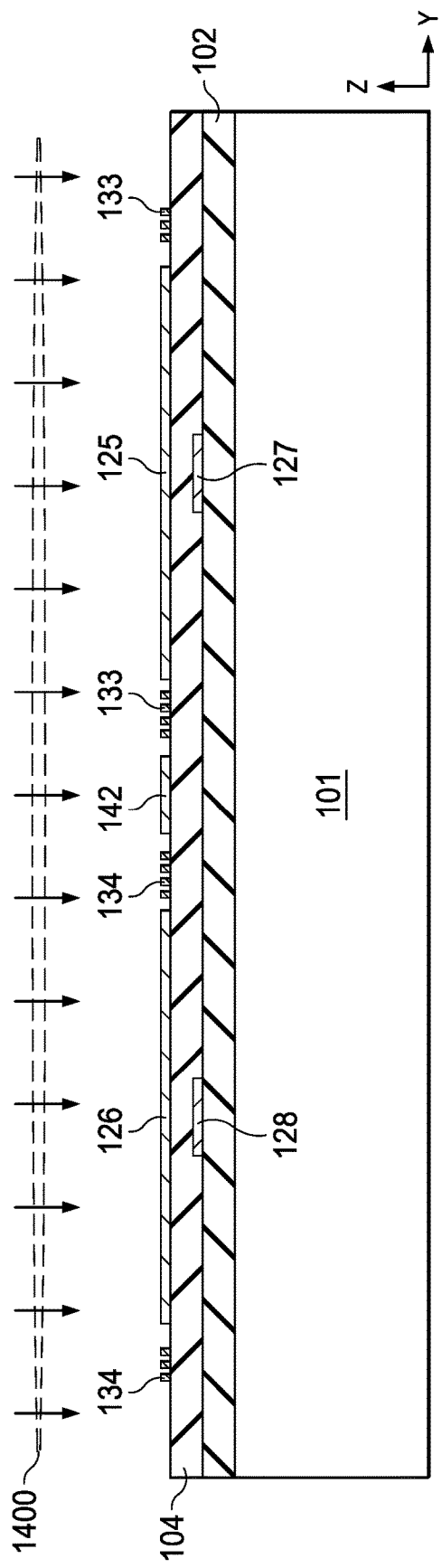
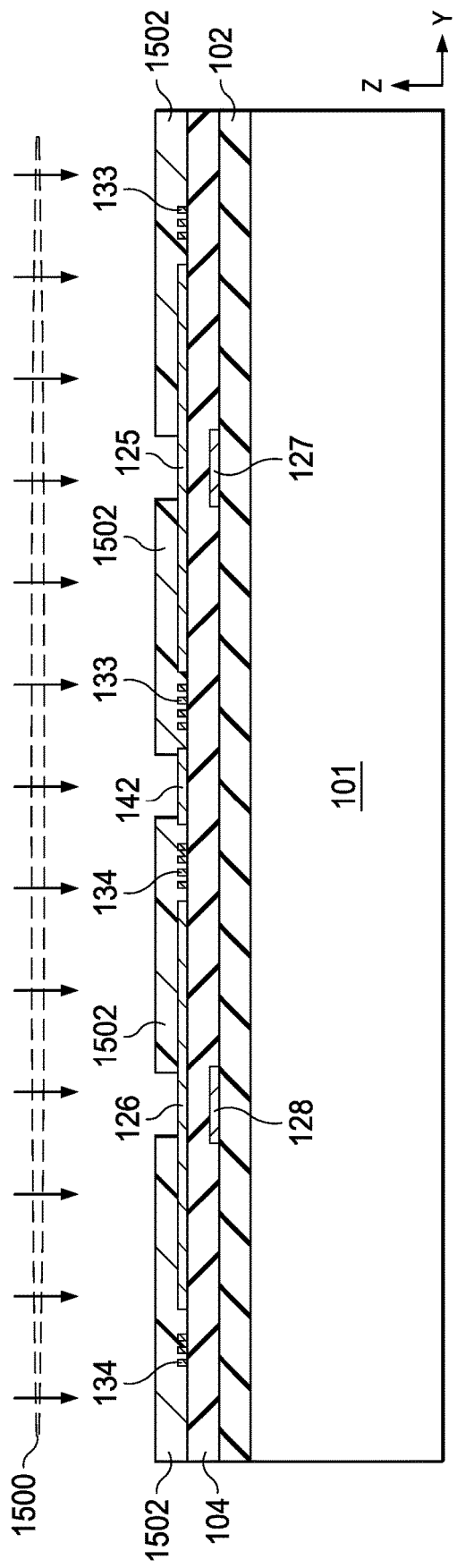
FIG. 14
FIG. 15

RESONANT INDUCTIVE-CAPACITIVE ISOLATED DATA CHANNEL

CROSS-REFERENCE TO RELATED APPLICATION

This application is a divisional of U.S. patent application Ser. No. 17/120,123 filed Dec. 12, 2020, which is hereby incorporated herein by reference.

BACKGROUND

Electrical isolation is used for signal, data or power transfer between circuits of different voltage domains. Isolation data channels can be used in isolated analog to digital converters for industrial sensing applications, isolated data channels for transmitter/receiver circuits, and in integrated isolated gate driver circuits for switch mode power supplies. Data channel circuits can be fabricated in integrated circuits using complementary metal oxide semiconductor (CMOS) or bipolar-CMOS (BICMOS) fabrication processes. Isolation components are added in isolation layers integrated on top of the wafer, but this increases wafer production cost and complexity through additional mask layers of metal and vias and inter level or inter layer dielectric (ILD) layers. Integrated isolation components also increase the product size because of isolation component size and keep-out zones to accommodate voltage differences between multiple voltage domains.

SUMMARY

According to one aspect, an electronic device has a substrate, and first and second metallization levels with a resonant circuit. The first metallization level has a first dielectric layer and a first metal layer. The first dielectric layer is on a side of the substrate, and the first metal layer is on the first dielectric layer. The second metallization level has a second dielectric layer and a second metal layer. The second dielectric layer is on the first dielectric layer and the first metal layer. The second metal layer is on the second dielectric layer. The electronic device includes a first plate in the first metal layer and a second plate in the second metal layer. The second plate is spaced apart from the first plate to form a capacitor. The electronic device includes a winding in one of the first or second metal layers. The winding is coupled to one of the first or second plates in a resonant circuit.

In one example, the first metal layer is in a first plane and the second metal layer is in a second plane that is spaced apart from and parallel to the first plane. In one implementation, the second dielectric layer separates the first and second planes, and the second plate is at least partially above the first plate. In one example, the electronic device has a protective overcoat layer on the second dielectric layer and the second metal layer, where the protective overcoat layer has an opening that exposes a portion of the second plate. In one example, the first dielectric layer separates the first plate and the substrate, and the resonant circuit includes a connection to the substrate, where the substrate and the first plate form another capacitor coupled in the resonant circuit.

In one example, the electronic device includes a third plate in the first metal layer, and a fourth plate in the second metal layer. The fourth plate is spaced apart from the third plate to form a second capacitor coupled in the resonant circuit. In one example, the electronic device includes a second winding in the first or second metal layers, where the second winding is coupled to the resonant circuit.

According to another aspect, an electronic device includes a package structure, first and second dies and leads. The first die has a substrate and first and second metallization levels with a resonant circuit. The first die is enclosed in the package structure. The first metallization level has a first dielectric layer on a side of the substrate and a first metal layer on the first dielectric layer. The second metallization level has a second dielectric layer on the first dielectric layer and the first metal layer, and a second metal layer on the second dielectric layer. The electronic device includes a first plate in the first metal layer and a second plate in the second metal layer, where the second plate is spaced apart from the first plate to form a capacitor. The electronic device includes a winding in one of the first or second metal layers, where the winding is coupled to one of the first or second plates in a resonant circuit. The second die is coupled to the resonant circuit, and the second die is enclosed in the package structure. A first lead is coupled to the resonant circuit, and a portion of the first lead extends out of the package structure. A second lead is coupled to the resonant circuit, and a portion of the second lead extends out of the package structure. In one example, the electronic device includes a third die coupled to the resonant circuit, where the third die is enclosed in the package structure.

According to another aspect, a method includes forming a first dielectric layer on a side of a substrate, forming a first metal layer on the first dielectric layer, the first metal layer having a first plate, forming a second dielectric layer on the first dielectric layer and on the first metal layer, and forming a second metal layer on the second dielectric layer. The second metal layer has a second plate spaced apart from the first plate, and a winding coupled to the second plate in a resonant circuit. The method in one example further includes forming a protective overcoat layer on the second dielectric layer and on the second metal layer, where the protective overcoat layer has an opening that exposes a portion of the second plate.

In one example, the method further includes coupling a die to the resonant circuit, coupling one of the second plate or the die to a lead, and enclosing the substrate, the first dielectric layer, the first metal layer, the second dielectric layer, the second metal layer, the protective overcoat layer, the die, and a portion of the lead in a package structure.

In one example, the method further includes coupling a second die to the resonant circuit, coupling the second die to a second lead, and enclosing the second die and a portion of the second lead in the package structure.

In one example, the method further includes coupling the second plate to a lead, and enclosing the substrate, the first dielectric layer, the first metal layer, the second dielectric layer, the second metal layer, the protective overcoat layer, and a portion of the lead in a package structure.

BRIEF DESCRIPTION OF THE DRAWINGS

FIG. 4 is a sectional side elevation view taken along line 4-4 in the electronic device of FIG. 1.

FIGS. 7-16 are sectional side elevation views of the electronic device of FIGS. 1-4 undergoing fabrication according to the method of FIG. 6.

DETAILED DESCRIPTION

Figure 1:
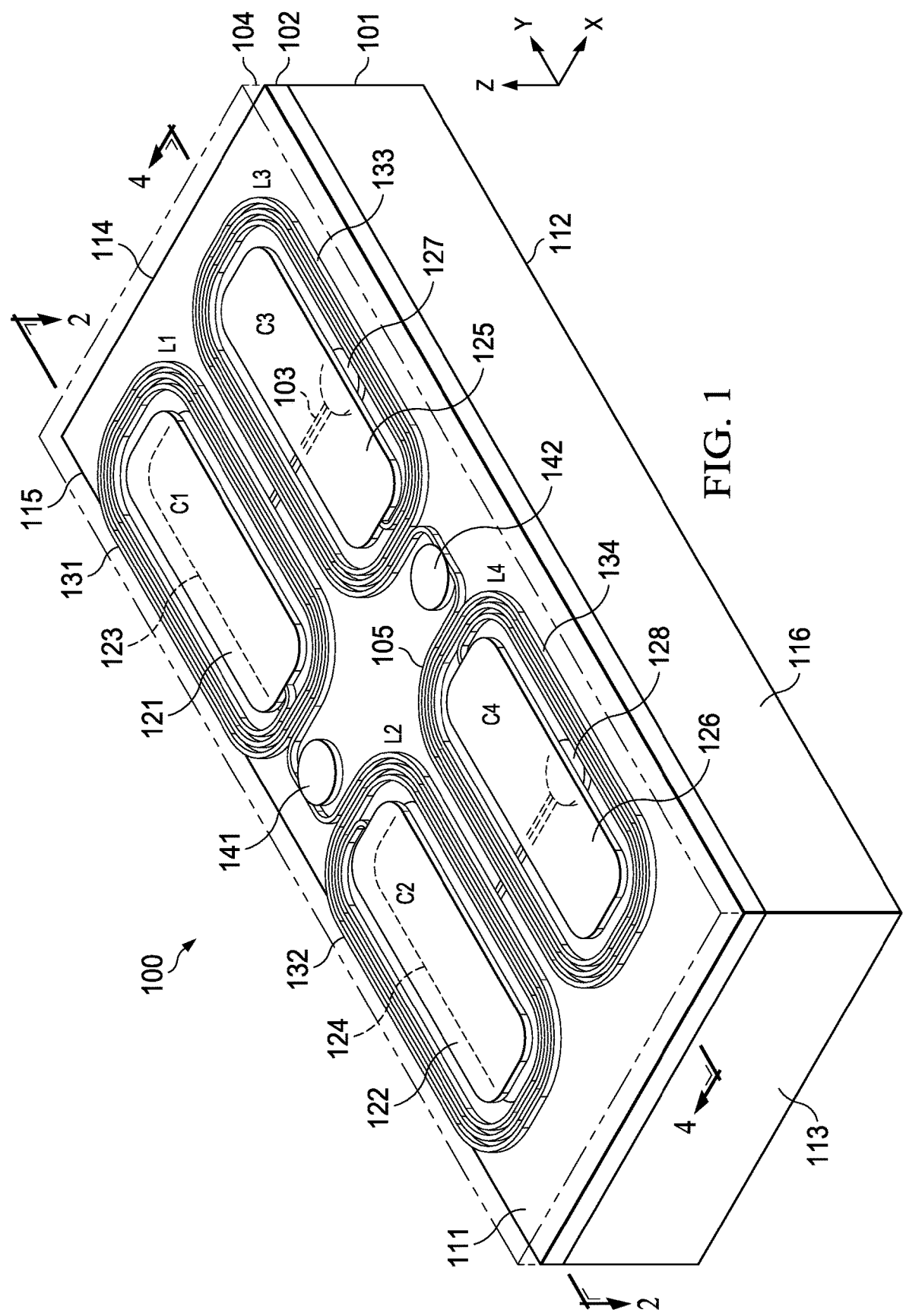
FIG. 1 is a perspective view of an electronic device with a substrate and a differential resonantly coupled inductor-capacitor circuit in a two-level metallization structure according to an embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
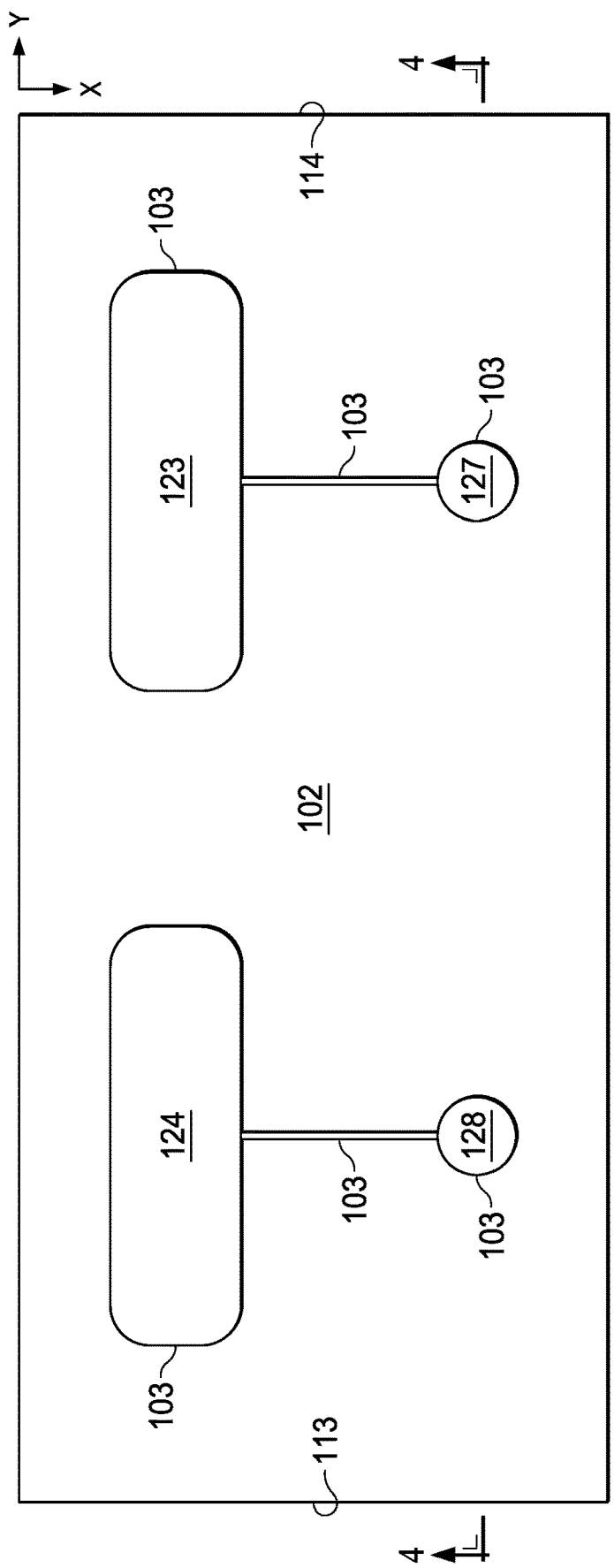
FIG. 2 is a sectional top view of a first metallization level taken along line 2-2 in the electronic device of FIG. 1.
Figure 3:
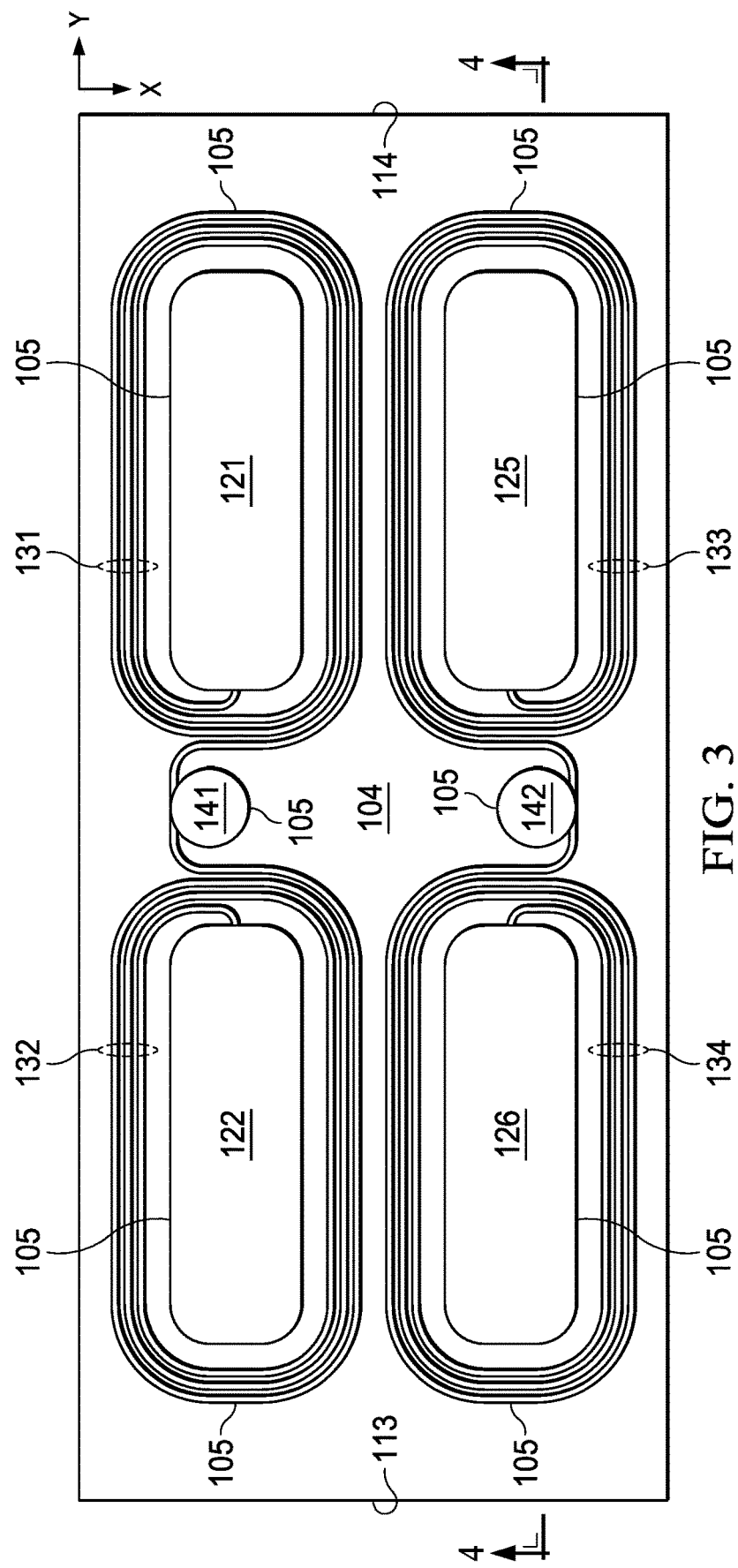
FIG. 3 is a top view of a second metallization level in the electronic device of FIG. 1.
Figure 5:
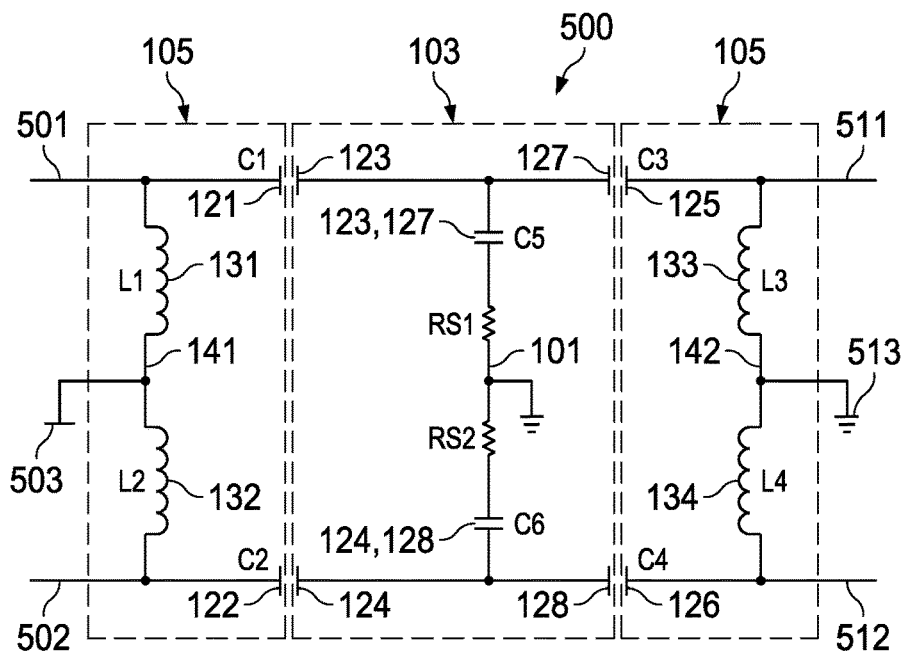
FIG. 5 is a schematic diagram of the differential input and output parallel resonance inductor-capacitor circuit of the electronic device of FIGS. 1-4.
Figure 6:
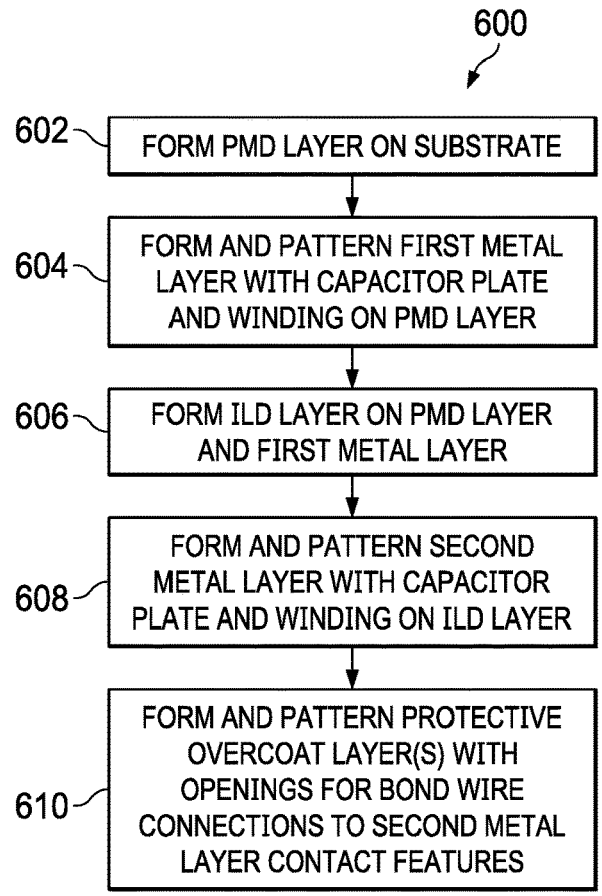
FIG. 6 is a flow diagram of a method for fabricating a semiconductor device according to another embodiment.

Referring to FIGS. 1-5, an electronic device 100 provides a low cost isolation solution with integrated resonant inductor-capacitor circuitry for a variety of applications, such as integrated isolated ADCs for industrial sensing, integrated isolated gate drivers, isolated communications channels for transmitter/receiver (TX/RX) circuits, amplifier circuits, etc. FIGS. 1-4 show an example implementation of the electronic device 100 with a substrate and a differential inductor-capacitor resonant circuit in a two-level metallization structure. FIG. 2 shows a first metallization level taken along line 2-2 of FIG. 1, and FIG. 3 shows the second metallization level in the electronic device 100. FIG. 4 shows a sectional side elevation view of the electronic device 100 taken along line 4-4 in FIG. 1. FIG. 5 shows the differential input and output parallel resonance inductor-capacitor circuit of the electronic device of FIGS. 1-4.

Described examples provide power, area and cost efficient solutions for use in low power compact circuits in which an isolation barrier is useful. The described examples, moreover, provide easy integration with advanced CMOS or BICMOS circuits on either or both sides of the isolation barrier, for example, by interconnection and packaging with one or more additional dies having transistor-based circuitry to provide multi-chip module (MCM) packaged electronic devices (e.g., standalone ICs) in dedicated isolation technology, without adding extra masks, complexity, isolation layers, and die area to the additional die or dies.

Described examples provide an electronic device 100 having a resonant circuit with first and second metallization levels, where the upper second metallization level provides exposed conductive features for wire bonding to interconnect the resonant circuit with one or more additional dies. In other implementations, the resonant circuit of the electronic device is interconnected with a single additional die. In further implementations, the electronic device includes more than two metallization levels. The illustrated example provides a cost-effective resident circuit to provide an isolation barrier interface between first and second voltage domain circuits, without requiring additional cost or size, or other change to the fabrication processes and structure of the additional die or dies. The integration of capacitors and inductors or transformer windings on a single, low cost electronic device 100, moreover, provide power efficiency improvements compared to locating passive isolation components on one or both additional dies.

The disclosed solutions facilitate optimization of the additional dies with respect to performance of the active circuitry thereof, without cost and size increase associated with directly integrating isolation components therein. In addition, the described examples provide a modular solution to allow electronic devices 100 of any desired form and type of resonant inductor-capacitor circuit tailored to a particular application, for easy integrated packaging with one or more additional dies, without having to redesign the circuitry of the additional die or dies.

FIGS. 1-4 show an example implementation of the electronic device 100 with a substrate 101 and a differential inductor-capacitor resonant circuit in a two-level metallization structure. The substrate 101 is or includes silicon (Si) or other semiconductor material. The electronic device 100 is manufactured by processing of a starting wafer. The starting wafer can be a silicon wafer, a silicon-on-insulator (SOI) wafer, a gallium nitride (GaN) wafer, etc. The electronic device 100 is illustrated in FIGS. 1-4 following die separation or singulation.

The electronic device 100 has a dual level metallization structure on a top side of the substrate 101. The metallization structure includes a differential inductor-capacitor (L-C) resonant circuit formed in first and second metallization levels. The first metallization level has a first dielectric layer 102 (e.g., silicon dioxide or $SiO_2$) and a first metal layer 103 (e.g., patterned copper or aluminum). The first dielectric layer 102 extends on the top side of the substrate 101. The first metal layer 103 extends on the first dielectric layer 102, and is patterned to include patterned features, such as plates, traces, etc., as shown in FIGS. 1, 2 and 4. In the example of FIGS. 1-4, the first metal layer 103 does not include windings for inductors and/or transformers. In other examples, the first metal layer 103 includes one or more windings for inductors and/or transformer components of a resonant circuit, for example, as described below in connection with FIG. 23.

The second metallization level in FIGS. 1-4 has a second dielectric layer 104 (e.g., SiO$_2$) and a second metal layer 105 (e.g., patterned copper or aluminum). The second dielectric layer 104 extends on a top side of the first dielectric layer 102 and a top side of the patterned features of the first metal layer 103. The second metal layer 105 extends on a top side of the second dielectric layer 104. The second metal layer 105 is patterned to include patterned features, such as plates, traces, windings, etc., as shown in FIGS. 1, 3 and 4. The second metal layer 105 in the illustrated example includes windings for inductors and/or transformers. In other examples, the first metal layer does not include windings.

Following die singulation, the electronic device 100 in FIG. 1 includes a first (e.g., top) side 111 and an opposite second (e.g., bottom) side 112. The first and second sides 111 and 112 are spaced apart from one another along the Z direction in FIG. 1. The electronic device 100 also has respective third and fourth (e.g., left and right) sides 113 and 114 laterally spaced apart from one another along the Y direction, as well as fifth (back) and sixth (front) sides 115 and 116 spaced apart from one another along the X direction in FIG. 1.

The patterned features of the second metal layer 105 include plates 121 and 122, and the patterned features of the first metal layer 103 include plates 123 and 124. The first metal layer 103 and the plates 124, 124 thereof are in a first plane. The second metal layer 105 and its plates 121 and 122 are in a second plane. The second plane is parallel to and spaced apart from the first plane along the Z direction in FIG. 1. The second dielectric layer 104 separates the first and second planes. The plates 123 and 121 form respective first and second plates of a first capacitor C1. The plates 123 and 121 are separated from one another by the second dielectric layer. The plates 124 and 122 form respective first and second plates of a second capacitor C2.

The patterned features of the second metal layer 105 include further plates 125 and 126, and the patterned features of the first metal layer 103 include further plates 127 and 128. The plate 125 forms a third capacitor C3 with the further plate 127. The plate 126 forms a fourth capacitor C4 with the further plate 128. In the example of FIGS. 1-4, the plate 121 is at least partially above the plate 123, the plate 122 is at least partially above the plate 124, the plate 125 is at least partially above the plate 127, and the plate 126 is at least partially above the plate 128. A conductive trace of the first metal layer 103 couples the plates 123 and 127 of the capacitors C1 and C3 together. Another conductive trace of the first metal layer 103 couples the plates 124 and 128 of the capacitors C2 and C4 together.

The patterned features of the second metal layer 105 also include windings 131, 132, 133, and 134 (FIGS. 1 and 3) that form respective inductors L1, L2, L3 and L4 indicated in FIG. 1. The windings 131-134 are coupled to respective capacitor plates 121, 122, 125 and 126 to form a resonant circuit of the two-level metallization structure of the electronic device 100. The windings 131, 132, 133, and 134 in this example each include multiple turns, with the first winding 131 extending around the plate 121 in the X-Y plane of the second metal layer 105. The second winding 132 extends around the plate 122, the third winding 133 extends around the plate 125, and the fourth winding 134 extends around the plate portions 126 of the second metal layer 105.

The second metal layer 105 also includes a plate 141 coupled to ends of the respective windings 131 and 132, as shown in FIGS. 1 and 3. In addition, the second metal layer 105 includes another plate 142 coupled to ends of the respective windings 133 and 134. The plates 121, 122, 125, 126, 141, and 142 of the second metal layer 105 provide six bond wire connection locations for coupling the resonant circuit of the electronic device 100 with one or more additional dies, as described further below in connection with FIG. 17.

FIG. 4 shows a sectional view along line 4-4 in the device 100 of FIG. 1. The first dielectric layer 102 has a thickness 401, and the second dielectric layer 104 has a thickness 402. The thickness 402 and the dielectric material (e.g., SiO$_2$) of the second dielectric layer 104, and the sizes of the capacitor plates 121-128 set the capacitance values of the capacitors C1-C4. In addition, the first plane of the first metal layer 103 is spaced apart from the substrate 101 by the thickness distance 401 of the first dielectric layer 102.

FIG. 5 shows one example resonant circuit 500 implemented in the electronic device 100 of FIGS. 1-4. The circuit 500 includes the capacitors C1-C4 and inductors L1-L4 described above, interconnected in a differential input and output parallel resonance inductor-capacitor circuit with differential inputs 501 and 502 and an input ground or reference connection 503. In one implementation, the inputs 501 and 502, as well as the reference connection 503, are bond wire connections to an input circuit die (e.g., FIG. 17 below). The circuit 500 also includes differential outputs 511 and 512 and an output ground or reference connection 513. In one implementation, the outputs 511 and 512, as well as the output reference connection 513, are bond wire connections to an input circuit die (not shown).

In the example of FIGS. 1-5, the output reference connection 513 is a connection to the substrate 101 of FIG. 1. In this implementation, the inductor-capacitor resonant circuit 500 of the electronic device 100 includes other capacitors C5 and C6, as well as substrate resistors RS1 and RS2 schematically illustrated in FIG. 5. As seen in FIGS. 1 and 4, the first dielectric layer 102 separates the first plane of the first metal layer 103 from the substrate 101. The substrate 101 and the first metal layer plates 127 and 128 form the respective capacitors C5 and C6 coupled in the resonant circuit 500.

Referring now to FIGS. 6-16, FIG. 6 shows a method 600 of manufacturing a packaged electronic device, and FIGS. 7-16 show the electronic device 100 of FIGS. 1-4 undergoing fabrication according to the method 600. The parameters of the method 600 can be tailored to provide high voltage isolation using thick SiO$_2$ second dielectric layer 104 with or without vias. The example process 600 is a simple low cost process to fabricate interconnected capacitors and inductors with two metal layers and five pattern levels to provide a resonant isolation channel solution that separates the isolation circuit processing from the processing of active transmit (input) and receive (output) circuits. The inductances and capacitances can be designed for any desired resonant frequency matching between channel input and output (e.g., TX/RX) circuits. The integration of the inductors and capacitors in the electronic device 100 reduces parasitic impedances to facilitate optimized resonant channels for low power data communication, isolated switch drivers, isolated converters for industrial sensor applications using different channel implementations.

The method 600 includes forming a first dielectric layer (e.g., a pre-metal dielectric or PMD layer) on a side of a substrate at 602. FIG. 7 shows one example, in which a deposition process 700 is performed that deposits or otherwise forms the first dielectric layer 102 (e.g., $SiO_2$) to the thickness 401 on the top side of the substrate 101. In one example, the method 600 further includes via formation, for example, to create one or more vias (e.g., tungsten, aluminum, copper, not shown) that extend through the first dielectric layer 102. In one implementation, such a via provides electrical connection to the substrate 101.

The method 600 continues at 604 with forming and patterning a first dielectric layer with one or more capacitor plates. In some examples, the first metal layer is patterned to include one or more windings, although not a strict requirement of all possible implementations. FIGS. 8-10 show one implementation, including a deposition process 800 in FIG. 8 that deposits copper or other suitable metal 103 on the top of the first dielectric layer 102. In FIG. 9, process 900 is performed using a patterned etch mask 902 that covers prospective plates 127 and 128. A process 1000 is performed in FIG. 10 that removes the etch mask 902, leaving the patterned features 127 and 128 of the first metal layer.

The method 600 continues at 606, with forming the second dielectric layer (e.g., and inter-layer dielectric or ILD layer) on the PMD layer and the first metal layer. FIG. 11 shows one example, in which a deposition process 1100 is performed that deposits the second dielectric layer 104 on the first dielectric layer 102 and the patterned features of the first metal layer 103. The process 1100 deposits the second dielectric layer 104 (e.g., $SiO_2$) to the thickness 402 on the top side of the first dielectric layer 102. The thicknesses 401 and 402 of the respective first and second dielectric layers 102 and 104 can be tailored by adjusting the respective deposition processes 700 and 1100 to provide a resulting electronic device 100 having a desired voltage withstand rating for input to output isolation, as well as to set the capacitance values of the resonant circuit capacitors C1-C6 of FIG. 1. In one example, the method 600 further includes via formation, for example, to create one or more vias (e.g., tungsten, aluminum, copper) that extend through the second dielectric layer 104 (not shown).

At 608, the method further includes forming and patterning the second metal layer 105 with one or more features including a capacitor plate and windings. In various implementations, one or both the first and second metallization structures can include windings to form inductors and/or transformers in the inductive-capacitive resonant circuit of the electronic device 100. The plate(s) and any included winding features of the second metal layer 105 are spaced apart from the patterned features of the first metal layer 103. In certain examples, one or more windings (e.g., 131-134) of the second metal layer 105 are coupled to one or more plates (e.g., 123, 124, 127, 128; 121, 122, 125, 126) in a resonant circuit of the device 100. FIGS. 12-14 show one implementation, including a deposition process 1200 in FIG. 12 that deposits copper or other metal 105 on the top of the second dielectric layer 104. FIG. 13 shows an etch process 1300 using a patterned etch mask 1302 that covers prospective features of the second metal layer. A process 1400 is performed in FIG. 14 that removes the etch mask 1302, leaving the patterned features of the second metal layer.

Figure 16:
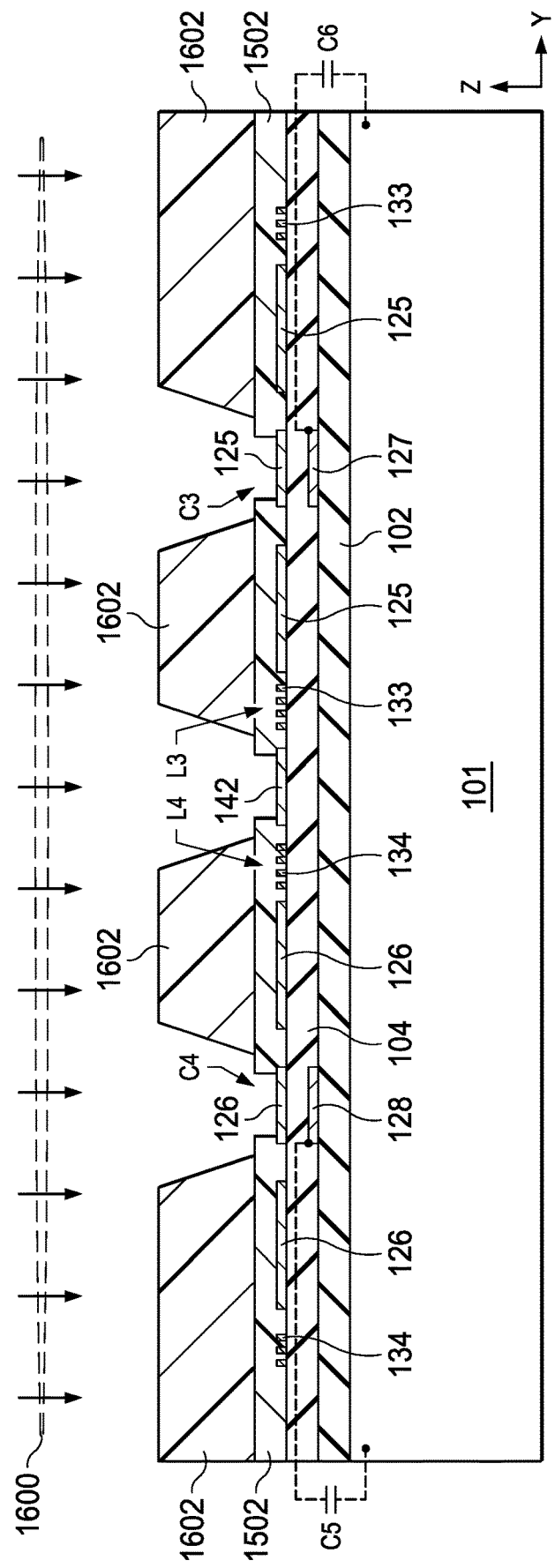

In one example, the method 600 further includes forming and patterning one or more protective overcoat layers with openings for bond wire connections to the second metal layer contact features at 610. FIGS. 15 and 16 show one example, in which a protective overcoat layer 1502 is formed on the topside of the second dielectric layer 104 and portions of the second metal layer 105. The first protective overcoat layer 1502 includes openings shown in FIG. 15 that expose portions of the plates 121, 122, 125, 126, 141, and 142 of the second metal layer 105 for subsequent bond wire connections. FIG. 16 shows a second deposition process 1600 that selectively deposits a second overcoat layer 1602 that has openings that expose portions of the plates 121, 122, 125, 126, 141, and 142 of the second metal layer 105. FIG. 16 schematically shows the capacitors C5 and C6 that respectively include the first metal layer plates 128 and 127 and form capacitors to the substrate 101.

Figure 17:
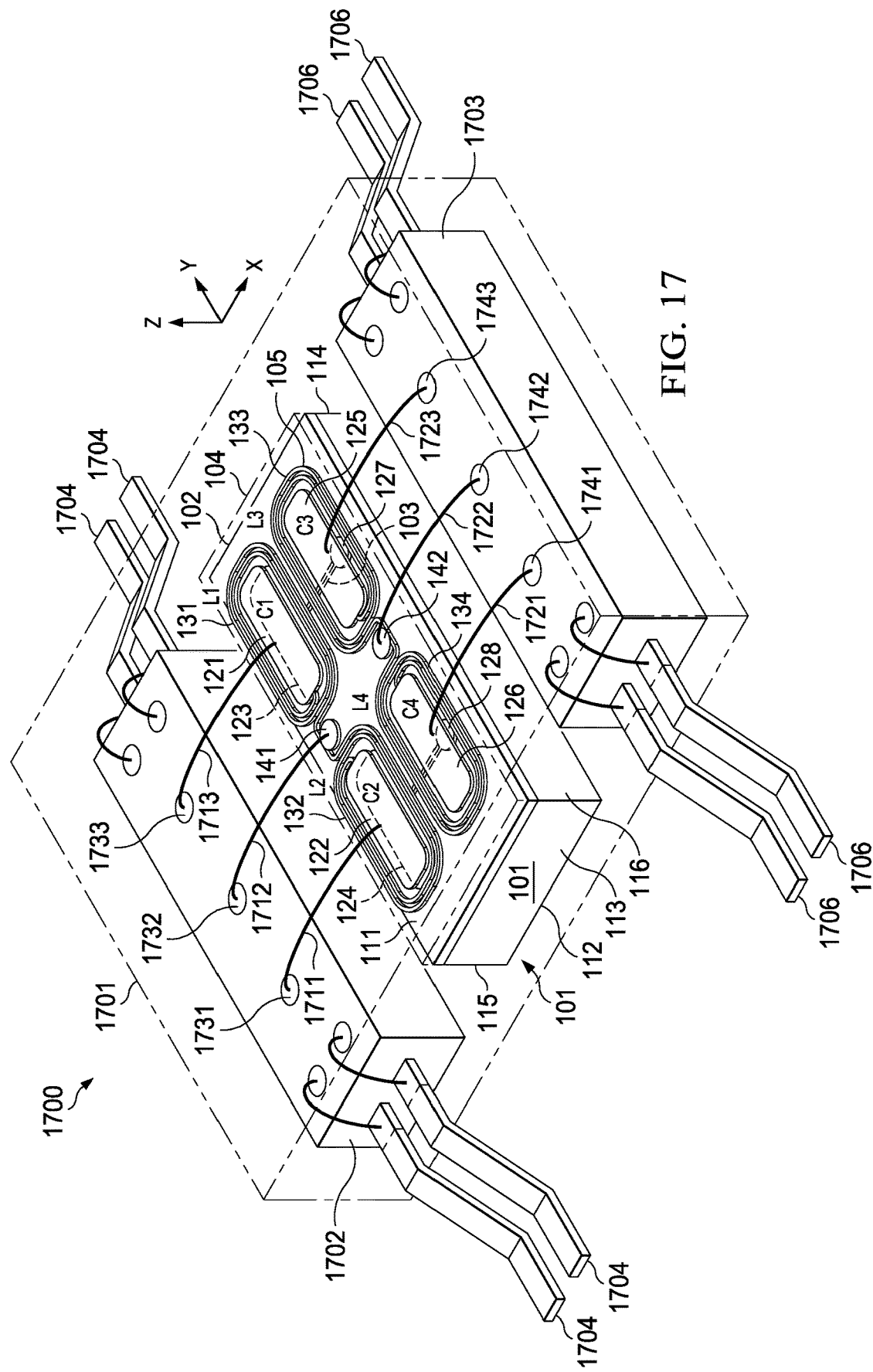
FIG. 17 is a perspective view of a multi-chip packaged electronic device including a transmitter chip, a receiver chip, and the electronic device of FIGS. 1-4.

Referring also to FIG. 17, the process 600 in one example further includes integration processing to incorporate the electronic device 100 into a packaged electronic device 1700. In one example, the fabrication method also includes coupling one or more additional dies to the resonant circuit of the electronic device 100, including coupling one or more plates of the electronic device 100 and/or one or more of the additional dies to a lead for external connection, as well as enclosing the substrate 101, the first dielectric layer 102, the first metal layer 103, the second dielectric layer 104, the second metal layer 105, the protective overcoat layer 1502, 1602, as well as the additional die or dies and one or more leads in a package structure 1701.

FIG. 17 shows an example multi-chip module (MCM) packaged electronic device 1700, which includes the electronic device 100 that forms an isolation barrier with an inductor-capacitor resonant circuit between two additional dies, enclosed in a package structure 1701 (e.g., molded material). The packaged electronic device 1700 includes a transmitter chip or die 1702 as well as a receiver chip or die 1703. The electronic device 100, the transmitter die 1702 and the receiver die 1703 in one example are mounted on respective die attach pad support structures (not shown) in the packaged electronic device 1700. The transmitter chip 1702 includes bond pads or other conductive features on a top side thereof, which allow connection of bond wires that couple circuit nodes of the transmitter chip 1702 to a first set of gull wing leads 1704. The packaged electronic device 1700 also includes second gull wing leads 1706 coupled to the receiver chip 1703.

The packaged electronic device 1700 includes further bond wires 1711, 1712 and 1713 that couple various circuit nodes of the transmitter chip 1702 to the respective plates 122, 141, and 121 of the resonant circuit of the electronic device 100. In addition, bond wires 1721, 1722, and 1723 couple circuit nodes of the receiver chip 1703 to the respective plates 126, 142, and 125 of the electronic device 100. In the illustrated example, the bond wire 1711 couples the capacitor plate 122 to a die pad 1731 of the transmitter chip 1702. In addition, the bond wire 1712 couples a die pad 1732 to the plate 141, and the bond wire 1713 couples a die pad 1733 of the transmitter chip 1702 to the capacitor plate 121 of the electronic device 100. The bond wire 1721 couples a die pad 1741 of the receiver chip 1703 to the capacitor plate 126, the bond wire 1722 couples a die pad 1742 to the plate 142, and the bond wire 1723 couples a die pad 1743 of the receiver chip 1703 to the capacitor plate 125 of the electronic device 100.

The packaged electronic device 1700 provides an isolation channel separated into three parts, including the resonant circuit of the electronic device 100 that is fabricated in a low cost CMOS process with only two metal layers 103 and 105. The electronic device 100 in this packaged device 1700 forms the isolation barrier and holds all bulky passive capacitor and inductor winding components used for both isolation and communication performance purposes.

The respective transmitter and receiver dies 1702 and 1703 include the active circuitry (TX/RX) of the isolation channels, and the dies 1702 and 1703 can be designed in any standard CMOS process without the need to integrate additional large and therefore costly passive components for the isolation channels. Moreover, as previously mentioned, the thicknesses of the dielectric layers 102 and 104 of the electronic device 100 (e.g., FIG. 4 above) can be tailored for voltage withstanding and resonant circuit capacitance design goals, independent of the fabrication and performance goals of the active circuitry in the respective transmitter and receiver dies 1702 and 1703.

In certain implementations, the electrical properties of the resonant circuit of the electronic device 100 are matched to the electrical properties of the circuitry in the respective transmitter and receiver dies 1702 and 1703, for example, to provide frequency and impedance matching, in addition to isolation barrier performance for a given design. The electronic device 100 provides flexibility in interfacing various transmitter and receiver circuit dies for a given application, in addition to improve performance and power efficiency by integrating the passive circuit components of the isolation barrier in a low cost electronic device.

Referring also to FIGS. 18-23, the packaged electronic device 1700 in FIG. 17 includes an isolated data channel with a differential input, parallel output resonance inductor-capacitor circuit 500 in the two-level metallization structure of the electronic device 100, as described above in connection with FIGS. 1-5. FIGS. 18-23 show other example inductor-capacitor resonant circuits in different embodiments of an electronic device 100 with a two-level metallization structure.

Figure 18:
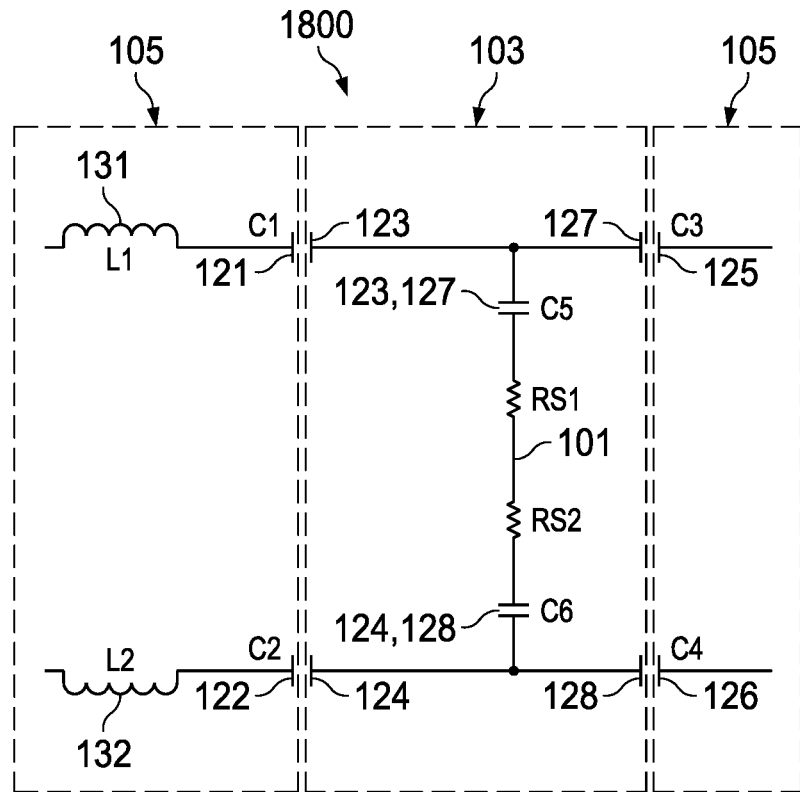
FIG. 18 is a schematic diagram of a differential input series resonance inductor-capacitor circuit according to another embodiment.

FIG. 18 shows a differential input, series resonance inductor-capacitor circuit 1800 implemented in the respective first and second metal layers 103 and 105 according to another embodiment. In this example, the respective first and second inductors L1 and L3 are not connected to one another, and the plate 141 is omitted, compared with the resonant circuit of FIGS. 1-5. In addition, the corresponding windings 131 and 132 are individually connected between a respective one of the capacitor plates 121 or 122 and a connection point for wire bonding to a transmitter circuit to provide a series resonant input to the resonant circuit 1800 of the device 100. Moreover, the third and fourth inductors L3 and L4 are omitted from the device compared with the resonant circuit 500 in FIGS. 1-5.

Figure 19:
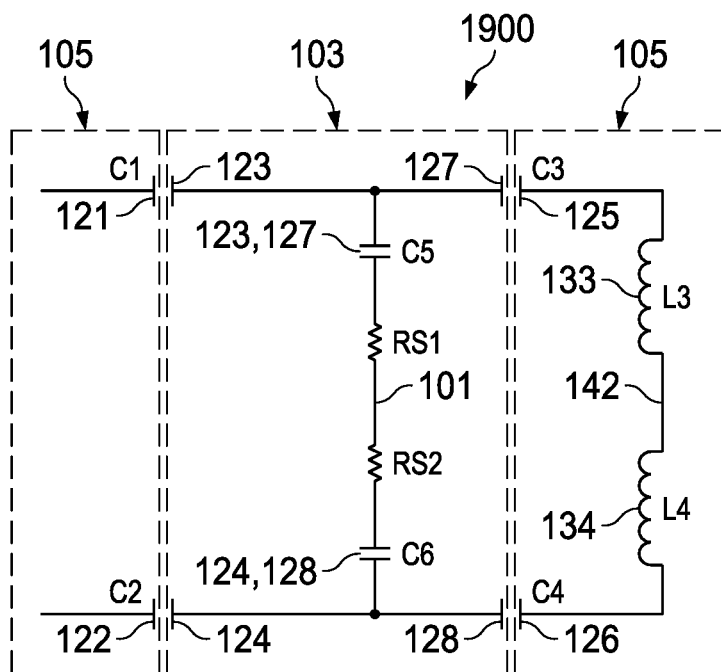
FIG. 19 is a schematic diagram of a differential output parallel resonance inductor-capacitor circuit according to another embodiment.

FIG. 19 shows another example resonant circuit 1900 implemented in a two-level metallization structure of the electronic device 100. The resonant circuit 1900 is a differential output parallel resonance inductor-capacitor circuit, in which the input side reference connection 141 and the inductors L1 and L2 (and the corresponding windings 131 and 132) of FIGS. 1-5 are omitted. In one implementation, a differential input (e.g., from the transmitter die 1702 in FIG. 17) is coupled to the capacitor plates 121 and 122 of the second metal layer 105. An output (e.g., receiver circuit) reference is coupled to the substrate 101 in one example. In another example, the output reference is coupled to the plate 142 that joins ends of the inductors L3 and L4 (e.g., windings 133 and 134.

Figure 20:
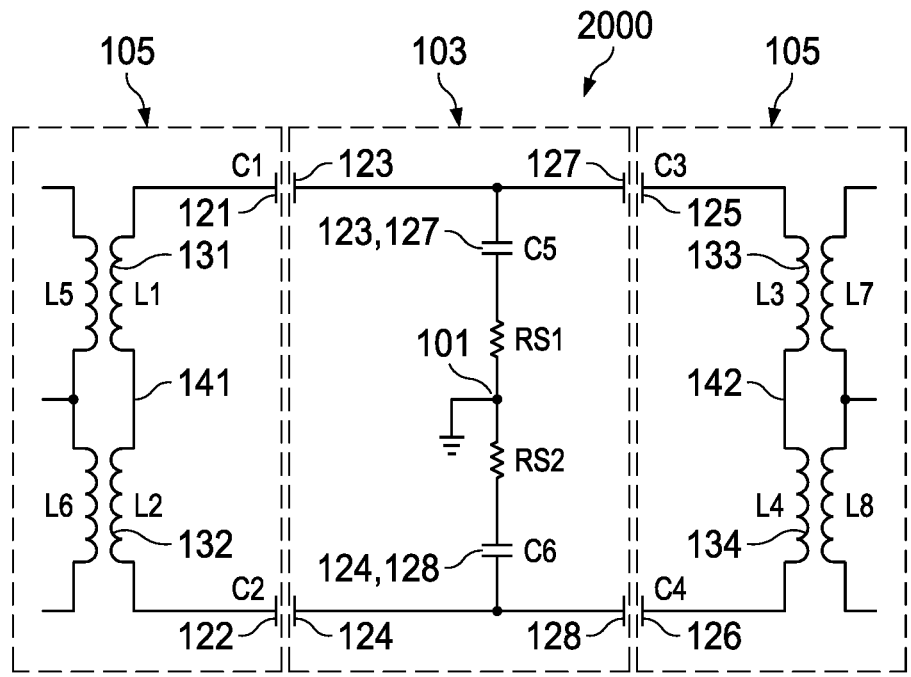
FIG. 20 is a schematic diagram of a differential input and output resonant transformer inductor-capacitor circuit according to another embodiment.

FIG. 20 shows an example resonant circuit 2000 implemented in a two-level metallization structure of the electronic device 100. The resonant circuit 2000 is a differential input, differential output resonant transformer inductor-capacitor circuit. In addition to the resonant circuit components of FIGS. 1-5 above, the resonant circuit 2000 of FIG. 20 includes primary windings labeled L5 and L6 in the second metal layer 105. The primary windings labeled L5 and L6 are magnetically coupled to respective secondary windings L1 and L2 of the input (e.g., transmitter side circuit). The primary and secondary windings in one example have different numbers of turns and form a transformer with a non-unity turns ratio to provide a non-unity voltage gain in the resonant circuit. The resonant circuit 2000 of FIG. 20 includes output (e.g., receiver) side transformer windings in the second metal layer 105. In this example, the inductors L3 and L4 are primary windings magnetically coupled to respective secondary windings L7 and L8 in the second metal layer 105. In certain implementations, primary and secondary windings are in respective ones of, or in both of, the first and second metal layers 103 and 105.

Figure 21:
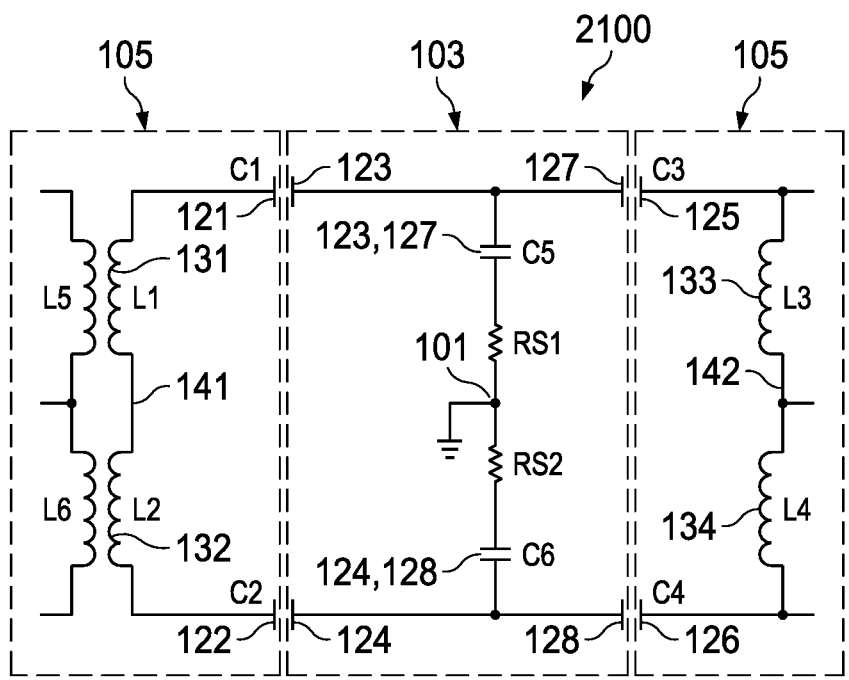
FIG. 21 is a schematic diagram of a differential input resonant transformer inductor-capacitor circuit according to another embodiment.

FIG. 21 shows another example resonant circuit 2100 implemented in a two-level metallization structure of the electronic device 100. The resonant circuit 2100 in this example is a differential input resonant transformer inductor-capacitor circuit. The circuit 2100 includes input side transformer coupling with components as discussed above in connection with FIG. 20. In this example, the output (e.g., receiver) side circuit omits the secondary windings L7 and L8, and the receiver circuit couples to the ends of the inductors L3 and L4 as described above in connection with FIGS. 1-5.

Figure 22:
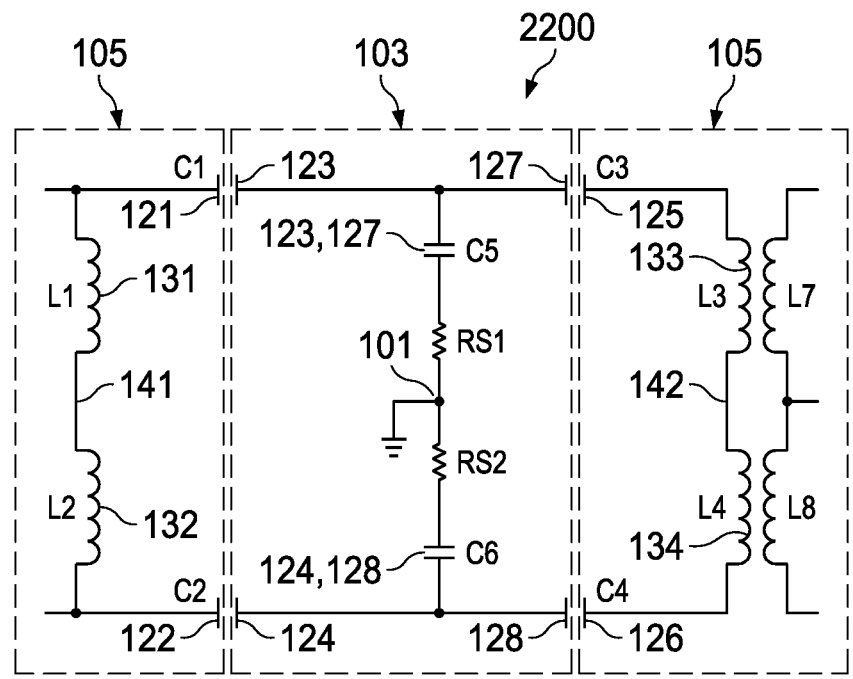
FIG. 22 is a schematic diagram of a differential output resonant transformer inductor-capacitor circuit according to another embodiment.

FIG. 22 shows an example resonant circuit 2200 implemented in a two-level metallization structure of the electronic device 100. The resonant circuit 2200 is a differential output resonant transformer inductor-capacitor circuit having output (e.g., receiver) side transformer coupling with components as discussed above in connection with FIG. 20. The input (e.g., transmitter) side circuitry is configured as described above in connection with FIGS. 1-5. In one example, the plate 141 in the second metal layer 105 provides a connection of an input reference or ground, although not a requirement of all possible implementations.

Figure 23:
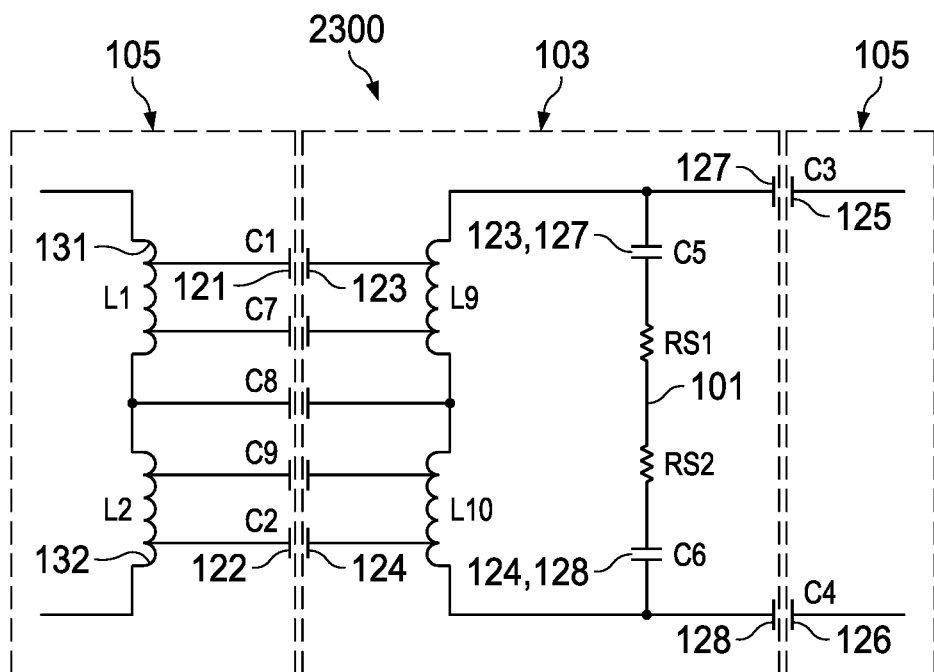
FIG. 23 is a schematic diagram of a differential input resonant transformer inductor-capacitor circuit according to another embodiment.

FIG. 23 another example resonant circuit 2300 implemented in a two-level metallization structure of the electronic device 100. The resonant circuit 2300 in this example is a differential input resonant transformer inductor-capacitor circuit. The inductors L1 and L2 described above (and the corresponding windings 131 and 132) include tap nodes and a joining node in the second metal layer 105. Capacitors C7, C8, C9, and C10 include plates in the second metal layer 105 and corresponding plates in the first metal layer 103. The capacitors C7, C8, C9, and C10 capacitively couple the tap nodes and joining node of the inductors L1 and L2 to respective tap nodes and a joining node of inductors L9 and L10 and corresponding windings in the first metal layer 103. The outer (e.g., top and bottom) ends of the respective inductors L9 and L10 are coupled to the respective capacitors C5 and C6, and to the first metal layer plates 127 and 128 of the respective capacitors C3 and C4. The plates 125 and 126 of the respective capacitors C3 and C4 in the second metal layer 105 are adapted to be coupled to an output (e.g., receiver) circuit. In one example, the substrate 101 is coupled to an output side reference, although not a requirement of all possible implementations.

In described examples, the electronic device 100 includes an isolation barrier constructed using a low-cost two-level metallization structure produced with a silicon fabrication process, in which the isolation barrier includes capacitors with plates on both metal layers. This process provides isolation performance and allows constructing reinforced isolation barriers due to thick isolation oxide between the voltage domains. In addition, one example includes a thick top metal layer 105 and large distance from the second metal layer 105 to the substrate 101 to facilitate high Q inductors.

The combination of such high Q inductors along with the isolation capacitors forms a resonant channel. The resonance of the device circuit facilitates an isolation data channel with high gain and hence lower power consumption, along with the cost advantage of keeping the large passive components (inductors and capacitances) on the low-cost process.

Different resonant circuit configurations support basic and reinforced applications (e.g., single and series isolation mediums), with process independence from the active circuitry of the additional dies in a packaged multi-chip module product (e.g., FIG. 17). Moreover, the integration of the resonant circuit capacitor(s) and inductor(s) of the electronic device 100 facilitates low power consumption and high energy-efficiency and robustness. In addition, the use of potentially large passive inductors and/or capacitors in the resonant circuit does not adversely impact the die area of the active circuit die or dies (e.g., dies 1702 and 1703 in FIG. 17). Furthermore, since the isolation channel components are fabricated in a standard CMOS process, its dimensions are smaller compared to laminate structure circuits, and can therefore fit to smaller packages while maintaining same performance at lower cost.

The example electronic device 100 provides a modular circuit block that can be implemented in a variety of different circuit configurations to accommodate different applications and performance goals, without modifying the active circuit processes used for the additional dies. This facilitates easy integration with complex active circuits and flexibility in the selection of manufacturing processes for any active circuit.

Figure 24:
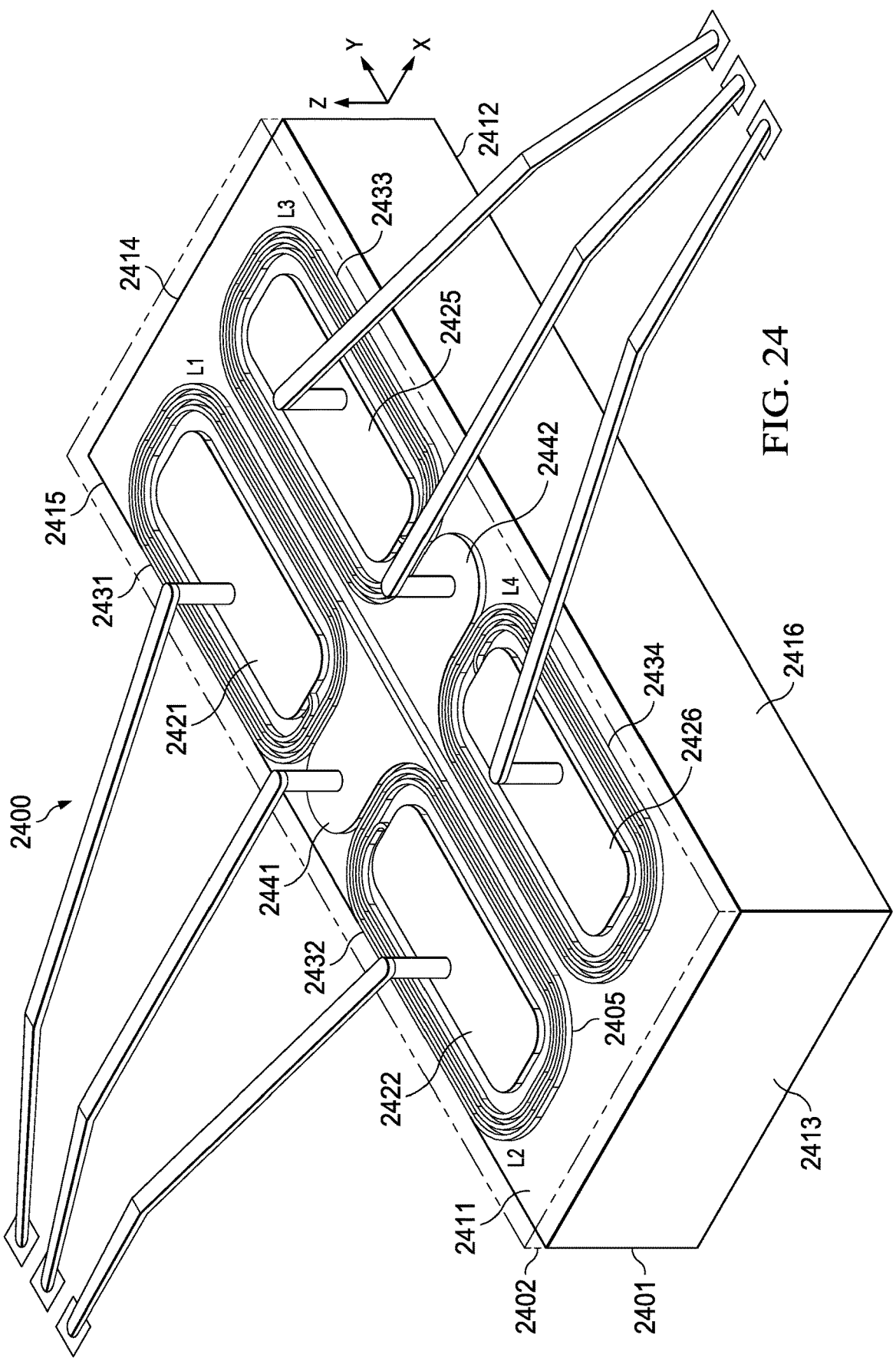
FIG. 24 is a perspective view of an electronic device with a substrate and a differential resonantly coupled inductor circuit in a single-level metallization structure according to another embodiment.
Figure 25:
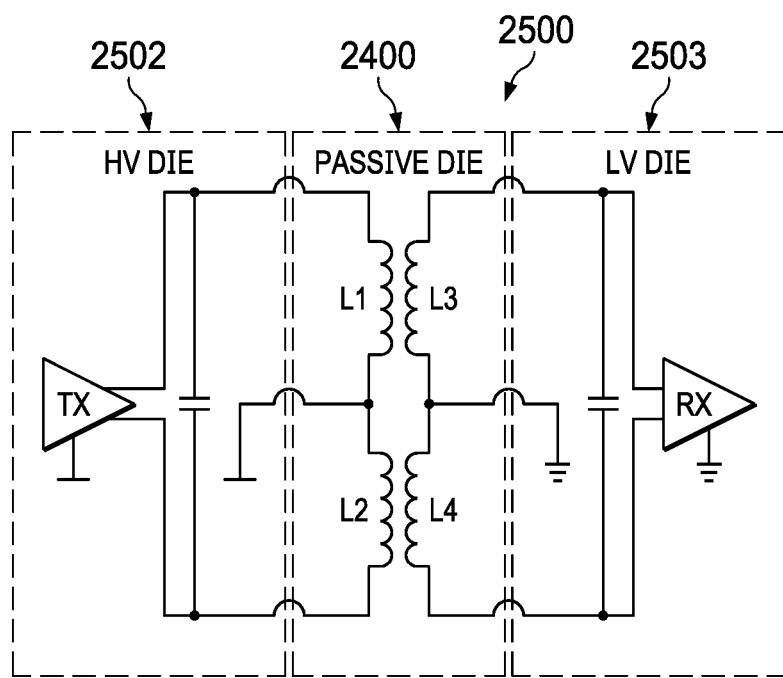
FIG. 25 is a schematic diagram of a multi-chip packaged electronic device including a transmitter chip, a receiver chip, and the electronic device of FIG. 24.

FIG. 24 shows another example electronic device 2400 with a substrate 2401 and a differential resonantly coupled inductor circuit in a single-level metallization structure according to another embodiment. The electronic device 2400 includes the substrate 2401, a single metallization level having a dielectric layer and a metal layer, in which the dielectric layer is on a side of the substrate and the metal layer is on the first dielectric layer. The electronic device 2400 also includes a primary winding in the metal layer, in which the primary winding is coupled to first and second plates in the metal layer. The electronic device 2400 also includes a secondary winding in the metal layer, in which the secondary winding is coupled to third and fourth plates in the metal layer. This example provides an inductor channel to implement a planar transformer in a single-level metallization structure, in which the primary and secondary windings are laterally spaced apart from one another. FIG. 25 shows a multi-chip packaged electronic device 2500 that includes a high voltage domain transmitter chip 2502, a low voltage domain receiver chip 2503 and the electronic device 2400 of FIG. 24. Resonant capacitors are provided on the high voltage domain transmitter chip 2502 and the low voltage domain receiver chip 2503. The chips 2502, 2400 and 2503 are coupled by wire bonding and packaged in a multi-chip packaged electronic device 2500 to provide an integrated isolated communications channel solution with a differential inductor-capacitor resonant circuit. The substrate 2401 is or includes silicon or other semiconductor material. The electronic device 2400 is manufactured by processing of a starting wafer. The starting wafer can be a silicon wafer, a silicon-on-insulator (SOI) wafer, a gallium nitride (GaN) wafer, etc. The electronic device 2400 is illustrated in FIGS. 24 and 35 following die separation or singulation.

The electronic device 2400 has a single-level metallization structure on a top side of the substrate 2401. The first metallization level has a dielectric layer 2402 (e.g., silicon dioxide or $SiO_2$) and a metal layer 2405 (e.g., patterned copper or aluminum) with patterned features that form windings and terminal end plates thereof to allow interconnection by wire bonding with the transmitter and receiver die circuitry shown schematically in FIG. 25. The dielectric layer 2402 extends on the top side of the substrate 2401. The metal layer 2405 extends on the dielectric layer 2402, and is patterned to include patterned features, such as plates, traces, etc., as shown in FIG. 24 to form a center tapped primary with inductors L1 and L2, as well as a center tapped secondary with inductors L3 and L4. Following die singulation, the electronic device 2400 in FIG. 24 includes a first (e.g., top) side 2411 and an opposite second (e.g., bottom) side 2412. The first and second sides 2411 and 2412 are spaced apart from one another along the Z direction in FIG. 24. The electronic device 2400 also has respective third and fourth (e.g., left and right) sides 2413 and 2414 laterally spaced apart from one another along the Y direction, as well as fifth (back) and sixth (front) sides 2415 and 2416 spaced apart from one another along the X direction in FIG. 24.

The patterned features of the metal layer 2405 include plates 2421 and 2422 that form end terminals of the primary winding, and plates 2425 and 2426 that form end terminals of the secondary winding. The patterned features of the metal layer 2405 also include windings 2431, 2432, 2433, and 2434 (FIGS. 24 and 3) that form the respective inductors L1, L2, L3 and L4 indicated in FIG. 24. The windings 2431-2434 are coupled to the respective plates 2421, 2422, 2425 and 2426 to provide bond wire connection terminals for the primary and secondary transformer windings of the electronic device 2400. The windings 2431, 2432, 2433, and 2434 in this example each include multiple turns, in which the first winding 2431 extends around the plate 2421 in the X-Y plane of the metal layer 2405. The second winding 2432 extends around the plate 2422, the third winding 2433 extends around the plate 2425, and the fourth winding 2434 extends around the plate portions 2426 of the metal layer 2405. The metal layer 2405 also includes a plate 2441 coupled to provide a primary winding center tap that joins ends of the respective windings 2431 and 2432. Also, the metal layer 2405 includes another plate 2442 coupled to ends of the respective windings 2433 and 2434 to provide a second side center tap. The plates 2421, 2422, 2425, 2426, 2441, and 2442 of the metal layer 2405 provide six bond wire connection locations for coupling the planar transformer of the electronic device 2400 with one or more additional dies, as shown in FIG. 25.

FIG. 25 shows one example resonant circuit implemented using capacitors of the dies 2502 and 2503 interconnected with the inductors L1-L4 of the electronic device 2400. This example device 2500 provides a multi-chip packaged electronic device with high voltage domain transmitter circuitry of the die 2502 interconnected with the low voltage domain receiver circuitry of the die 2503 in a differential input and output parallel resonance inductor-capacitor circuit. This example also provides input and output domain ground or reference connections via the center tap plates 2441 and 2442. This example facilitates signal transfer by inductive coupling using the device 2400 using only 1 metal layer with no need to meet capacitor-ratio of SA capacitors for electric field balancing, and better CMTI performance due to lower capacitance while providing resonance with parasitic capacitances on active and passive dies.

Modifications are possible in the described examples, and other implementations are possible, within the scope of the claims.

What is claimed is:

1. A method of manufacturing a packaged electronic device, the method comprising:
   forming a first dielectric layer on a side of a substrate;
   forming a first metal layer on the first dielectric layer, the first metal layer having a first plate;
   forming a second dielectric layer on the first dielectric layer and on the first metal layer;
   forming a second metal layer on the second dielectric layer, the second metal layer comprising:
      a second plate spaced apart from the first plate; and
      a winding around the second plate in a resonant circuit; and
   forming a protective overcoat layer on the second dielectric layer and on the second metal layer, the protective overcoat layer having an opening that exposes a portion of the second plate.

2. The method of claim 1, further comprising:
   coupling a die to the resonant circuit;
   coupling one of the second plate or the die to a lead; and
   enclosing the substrate, the first dielectric layer, the first metal layer, the second dielectric layer, the second metal layer, the protective overcoat layer, the die, and a portion of the lead in a package structure.

3. The method of claim 2, further comprising:
   coupling a second die to the resonant circuit;
   coupling the second die to a second lead; and
   enclosing the second die and a portion of the second lead in the package structure.

4. The method of claim 1, further comprising:
   coupling the second plate to a lead; and
   enclosing the substrate, the first dielectric layer, the first metal layer, the second dielectric layer, the second metal layer, the protective overcoat layer, and a portion of the lead in a package structure.

5. A method of manufacturing a packaged electronic device, the method comprising:
   forming a first dielectric layer on a substrate;
   forming a first metal layer on the first dielectric layer, the first metal layer comprising a first plate and a second plate;
   forming a second dielectric layer on the first dielectric layer and on the first metal layer; and
   forming a second metal layer on the second dielectric layer, the second metal layer comprising:
      a third plate spaced apart from the first plate;
      a first winding around the third plate;
      a fourth plate spaced apart from the second plate; and
      a second winding around the fourth plate.

6. The method of claim 5, further comprising forming a protective overcoat layer on the second dielectric layer and on the second metal layer, the protective overcoat layer having an opening that exposes a portion of the third plate.

7. The method of claim 5, wherein the second winding is coupled to the first winding, the second metal layer further comprising a fifth plate coupled to the first winding and to the second winding.

8. The method of claim 5, wherein the first winding and the second winding form a transformer.

9. The method of claim 5, wherein the first winding has a first number of turns, the second winding has a second number of turns, the first number of turns is greater than the second number of turns.

10. The method of claim 5, further comprising wire bonding the third plate to a chip.

11. The method of claim 10, wherein the chip is a first chip, the method further comprising wire bonding the fourth plate to a second chip.

12. A method of manufacturing an electronic device, the method comprising:
   obtaining an isolation barrier chip comprising a resonant circuit comprising a first plate and a second plate coupled to the first plate;
   wire bonding the first plate to a transmitter chip;
   wire bonding the second plate to a receiver chip; and
   applying a protective overcoat to the isolation barrier chip, to the transmitter chip, and to the receiver chip.

13. The method of claim 12, wherein the resonant circuit comprises:
   a first dielectric layer;
   a first metal layer on the first dielectric layer, the first metal layer comprising a third plate and a fourth plate;
   a second dielectric layer over the first dielectric layer and the first metal layer; and
   a second metal layer on the second dielectric layer, the second metal layer comprising:
      the first plate;
      a first winding around the first plate;
      the secnd plate; and
      a second winding around the second plate.

14. The method of claim 13, wherein the second metal layer further comprises a fifth plate coupled to the first winding and a sixth plate coupled to the second winding, the method further comprising:
   wire bonding the fifth plate to the transmitter chip; and
   wire bonding the sixth plate to the receiver chip.

15. The method of claim 12, further comprising:
   coupling a first circuit node of the transmitter chip to a first gull wing lead; and
   coupling a second circuit node of the receiver chip to a second gull wing lead.

16. The method of claim 12, wherein the resonant circuit comprises:
   a dielectric layer; and
   a metal layer on the dielectric layer, the metal layer comprising:
      the first plate;
      a first winding around the first plate;
      the second plate; and
      a second winding around the second plate.

* * * * *